United States Patent
Yoon et al.

(10) Patent No.: US 10,774,728 B2
(45) Date of Patent: Sep. 15, 2020

(54) FAULT DIAGNOSIS APPARATUS OF COOLANT CIRCULATION SYSTEM FOR VEHICLE

(71) Applicants: HYUNDAI MOTOR COMPANY, Seoul (KR); KIA MOTORS CORPORATION, Seoul (KR)

(72) Inventors: Gun Seok Yoon, Seoul (KR); Jin Oh, Seoul (KR); Hyun Jun Soh, Seongnam-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/409,228

(22) Filed: May 10, 2019

(65) Prior Publication Data

US 2020/0182131 A1    Jun. 11, 2020

(30) Foreign Application Priority Data

Dec. 11, 2018    (KR) .................... 10-2018-0158993

(51) Int. Cl.
*F04B 17/03*    (2006.01)
*F01P 7/14*    (2006.01)
*F01P 11/14*    (2006.01)
*G07C 5/08*    (2006.01)
*G01R 31/00*    (2006.01)

(52) U.S. Cl.
CPC ............ *F01P 11/14* (2013.01); *G01R 31/006* (2013.01); *G07C 5/0808* (2013.01)

(58) Field of Classification Search
CPC .. F04B 17/03; F04B 17/05; F04B 1/28; F04B 2203/0201; F01P 7/14; F01P 7/164
See application file for complete search history.

(56) References Cited

U.S. PATENT DOCUMENTS

| | | | |
|---|---|---|---|
| 10,054,030 B2* | 8/2018 | Duan | F01P 7/164 |
| 2014/0318482 A1* | 10/2014 | D'Epiro | F01P 7/165 |
| | | | 123/41.1 |
| 2015/0219104 A1* | 8/2015 | Lee | F04D 15/0254 |
| | | | 417/42 |
| 2016/0159247 A1* | 6/2016 | Lee | H01M 8/0494 |
| | | | 429/437 |
| 2017/0011566 A1* | 1/2017 | Woo | G07C 5/0808 |
| 2018/0106256 A1* | 4/2018 | Lee | F04D 15/0236 |
| 2019/0186853 A1* | 6/2019 | Jin | H01M 8/04298 |

FOREIGN PATENT DOCUMENTS

KR    10-2018-0053912 A    5/2018

* cited by examiner

*Primary Examiner* — Long T Tran
(74) *Attorney, Agent, or Firm* — Morgan, Lewis & Bockius LLP

(57) ABSTRACT

A fault diagnosis apparatus of a coolant circulation system for a vehicle includes: a water pump for circulating coolant; a controller for applying a revolutions per minute (RPM) command to the water pump; a water pump driver for operating the water pump depending on the applied RPM command; and a current sensor for sensing an current input to the water pump driver. The controller determines whether the input current sensed by the current sensor is within a predetermined normal range to determine whether the coolant circulation system is failed or not.

10 Claims, 3 Drawing Sheets

[FIG. 1]
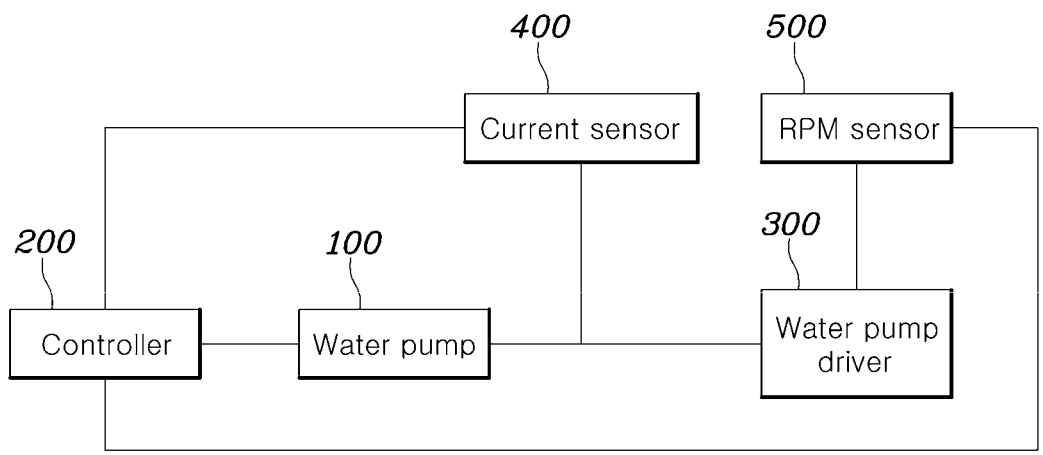

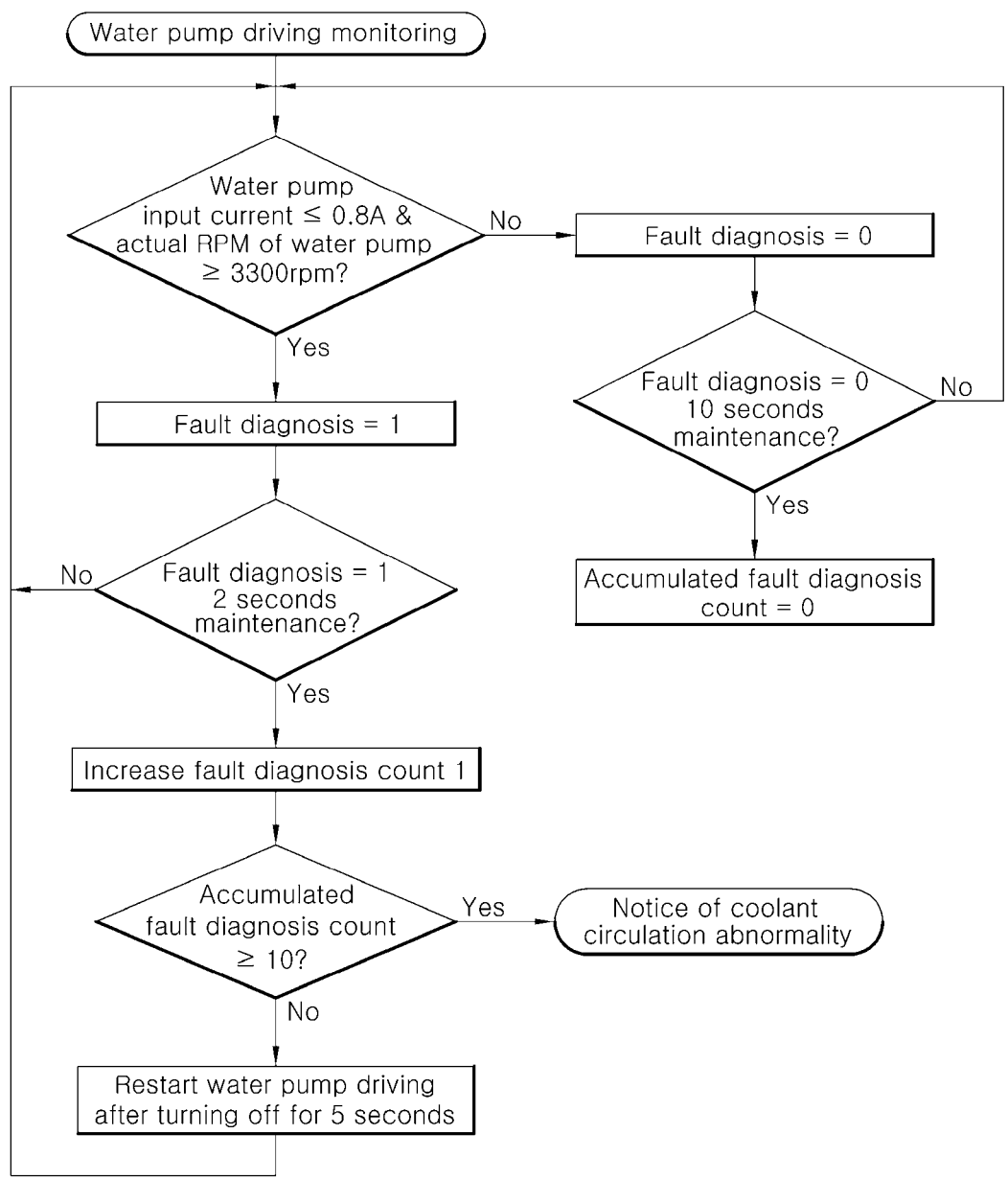
[FIG. 2]

[FIG. 3]
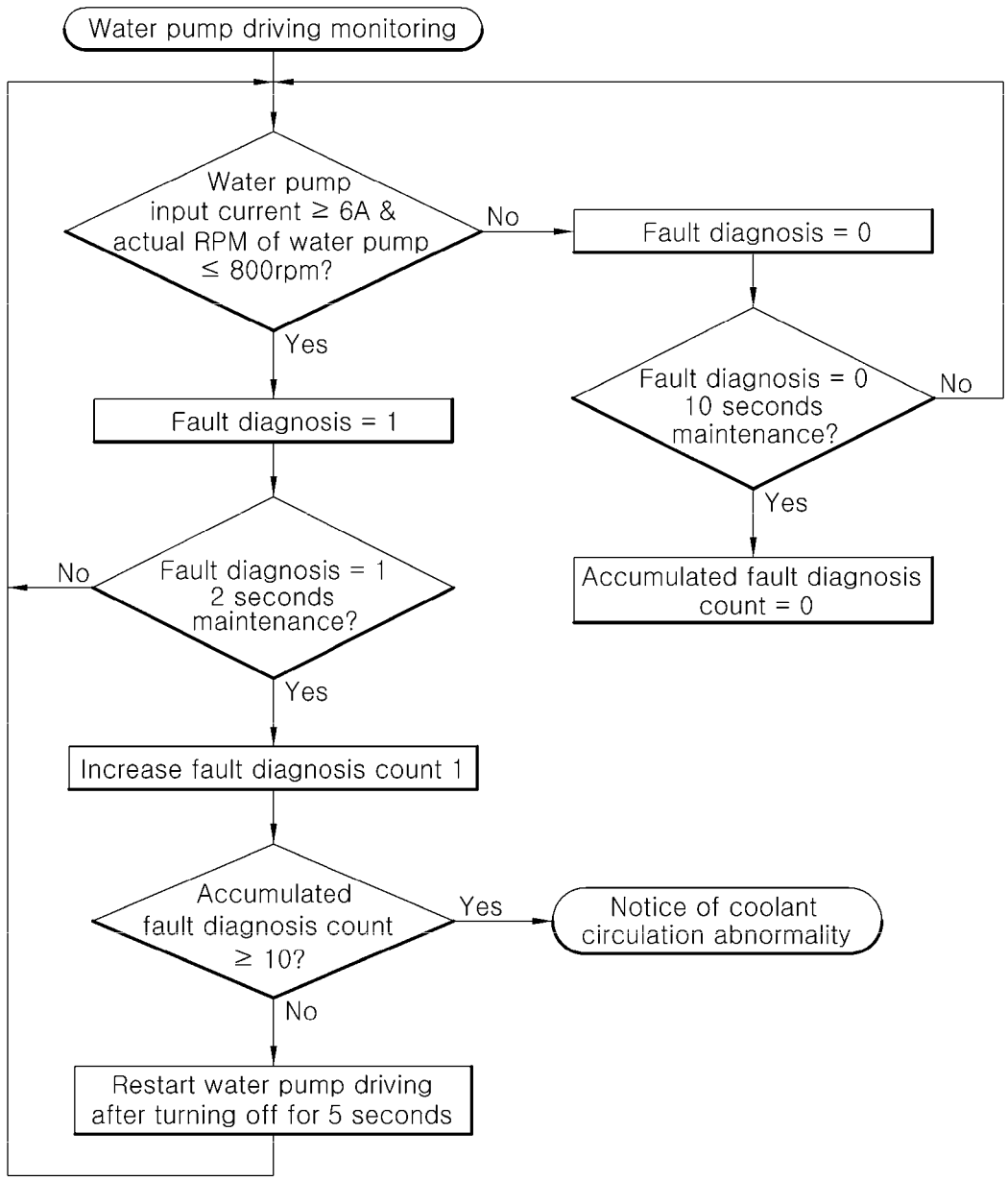

FAULT DIAGNOSIS APPARATUS OF COOLANT CIRCULATION SYSTEM FOR VEHICLE

CROSS REFERENCE TO RELATED APPLICATION

The present application claims the benefit of priority to Korean Patent Application No 10-2018-0158993 filed on Dec. 11, 2018 in the Korean Intellectual Property Office the entire contents of which is incorporated herein for all purposes by this reference.

TECHNICAL FIELD

The present disclosure relates to a fault diagnosis apparatus of a coolant circulation system for a vehicle, and more particularly, a fault diagnosis apparatus of a coolant circulation system for a vehicle capable of diagnosing a fault of a coolant circulation system during running of the vehicle.

BACKGROUND

Generally, in a vehicle equipped with an internal combustion engine, heat generated in the engine is transferred to a cylinder head, a piston, a valve, and so on. If the temperature of the above components excessively increases, the material strength thereof will be lowered to cause failure or shorten the life span. Therefore, a cooling means is provided in the engine for cooling the internal combustion engine. In a vehicle equipped with a motor, and so on, such as a hybrid vehicle or an electric vehicle, a high-voltage battery and various power conversion devices are provided for driving a motor. As such high-voltage batteries and various power conversion devices, and so on, generate high temperature, cooling means is also provided in a vehicle equipped with a motor.

A water-cooled cooling system has been commonly used as a cooling means. This water-cooled cooling system circulates a coolant through a cooling passage and cools heated components. It is thus important to check whether the coolant is insufficient or not because the cooling system cannot operate properly if the coolant circulated in the cooling passage is insufficient.

However, the conventional method of checking coolant shortage is possible only when the vehicle speed is equal to or less than a specific vehicle speed, the voltage of the auxiliary battery is equal to or greater than a specific value, and the inclination of the road is equal to or less than a specific value. Therefore, when the above conditions are not satisfied, it is impossible to diagnose the shortage of the coolant, and accordingly, even if a fault occurred in which the coolant leaks during the running of the vehicle, the fault diagnosis is impossible. Since the coolant leakage described above can lead to a safety accident of the vehicle, it is necessary to develop a technique for diagnosing the state of the coolant even when the vehicle is running.

The foregoing is intended merely to aid in the understanding of the background of the present disclosure, and is not intended to mean that the present disclosure falls within the purview of the related art that is already known to those skilled in the art.

SUMMARY OF THE DISCLOSURE

The present disclosure has been made keeping in mind the above problems occurring in the related art, and the present disclosure is intended to propose a fault diagnosis apparatus of a coolant circulation system for a vehicle capable of diagnosing a fault of a coolant circulation system during running of a vehicle.

A fault diagnosis apparatus of a coolant circulation system for a vehicle according to an exemplary embodiment of the present disclosure may include: a water pump for circulating coolant; a controller for applying a revolutions per minute (RPM) command to the water pump; a water pump driver for operating the water pump depending on the applied RPM command; and a current sensor for sensing an current input to the water pump driver; and wherein the controller determines whether the input current sensed by the current sensor is within a predetermined normal range to determine whether the coolant circulation system is failed or not.

An RPM sensor for sensing an actual RPM of the water pump driver may be further included.

The controller may determine whether the coolant circulation system is failed or not by determining whether the actual RPM sensed by the RPM sensor is within a predetermined normal range.

The controller may determine as a load shortage fault of the coolant circulation system when the input current is equal to or lower than a lower limit value of the predetermined normal range and the actual RPM is equal to or greater than an upper limit value of the predetermined normal range, and start a fault count.

The controller may increase the fault count of the coolant circulation system by one when the input current is equal to or lower than the lower limit value of the predetermined normal range and the actual RPM is equal to or greater than the upper limit value of the predetermined normal range for a predetermined time or longer, but determine as a final fault of the coolant circulation system when the accumulated fault count becomes equal to or greater than a predetermined count.

The controller may provide a final fault state alarm to a driver when it is determined that the coolant circulation system becomes the final fault.

The controller may operate the water pump again after turning off the water pump for a certain period of time when the accumulated fault count is equal to or lower than the predetermined count.

The controller may reset the accumulated fault count to zero when the input current and the actual RPM are maintained within the predetermined normal range for the predetermined time.

The controller may determine as an excessive load fault of the coolant circulation system when the input current is equal to or greater than the upper limit value of the predetermined normal range and the actual RPM is equal to or lower than the lower limit value of the predetermined normal range, to start the fault count.

The controller may increase the fault count of the coolant circulation system by one when the input current is equal to or greater than the upper limit value of the predetermined normal range and the actual RPM is equal to or lower than the lower limit value of the predetermined normal range for the predetermined time or longer, but the controller may determine as the final fault of the coolant circulation system when the accumulated fault count is equal to or greater than the predetermined count.

The controller may provide a final fault state alarm to a driver when it is determined that the coolant circulation system becomes the final fault.

The controller may operate the water pump again after turning off the water pump for a certain period of time when the accumulated fault count is equal to or lower than the predetermined count.

The controller may reset the accumulated fault count to zero when the input current and the actual RPM are maintained within the predetermined normal range for the predetermined time.

In accordance with the present disclosure, it is easily diagnose a fault of the coolant circulation system even when a vehicle is running.

In addition, by notifying a driver of whether the coolant circulation system is failed, the driver can easily check whether the coolant circulation system is failed or not, and accordingly, by repairing the fault of the coolant circulation system, it is possible to prevent a safety accident that may occur due to the fault of the coolant circulation system.

BRIEF DESCRIPTION OF THE DRAWINGS

The above and other objects, features and other advantages of the present disclosure will be more clearly understood from the following detailed description when taken in conjunction with the accompanying drawings, in which:

FIG. 1 is a block diagram of a configuration of a fault diagnosis apparatus of a coolant circulation system for a vehicle according to an exemplary embodiment of the present disclosure;

FIG. 2 is a flowchart showing a flow for determining a load shortage of the coolant circulation system when the vehicle is running in the fault diagnosis apparatus of the coolant circulation system for the vehicle according to an exemplary embodiment of the present disclosure; and FIG. 3 is a flowchart showing a flow for determining an excessive load of the coolant circulation system when the vehicle is running in the fault diagnosis apparatus of the coolant circulation system for the vehicle according to an exemplary embodiment of the present disclosure.

DETAILED DESCRIPTION OF THE DISCLOSURE

Hereinafter, a fault diagnosis apparatus of a coolant circulation system for a vehicle according to an exemplary embodiment of the present disclosure will be described with reference to the attached drawings.

FIG. 1 is a block diagram of a configuration of a fault diagnosis apparatus of a coolant circulation system for a vehicle according to an exemplary embodiment of the present disclosure, FIG. 2 is a flowchart showing a flow for determining a load shortage of the coolant circulation system when the vehicle is running in the fault diagnosis apparatus of the coolant circulation system for the vehicle according to an exemplary embodiment of the present disclosure, and FIG. 3 is a flowchart showing a flow for determining an excessive load of the coolant circulation system when the vehicle is running in the fault diagnosis apparatus of the coolant circulation system for the vehicle according to an exemplary embodiment of the present disclosure.

As shown in FIG. 1, the fault diagnosis apparatus of the coolant circulation system for the vehicle according to an exemplary embodiment may be configured to include a water pump 100 circulating coolant, a controller 200 applying a revolutions per minute (RPM) command to the water pump 100, a water pump driver 300 driving the water pump 100 depending on the applied RPM command; a current sensor 400 for sensing a current input to the water pump driver 300; and an RPM sensor 500 for sensing an actual RPM of the water pump driver 300.

The present disclosure is an apparatus capable of diagnosing a fault of the coolant circulation system when the vehicle is running and capable of determining whether the coolant circulation system is failed or not based on the current input to the water pump driver 300 and the actual RPM of the water pump driver 300 depending on the RPM command applying to the water pump. Hereinafter, referring FIGS. 2 and 3, diagnosing of the fault of the coolant circulation system will be explained in detail.

The controller 200 may apply the RPM command to the water pump 100 and determine whether the coolant circulation system is failed or not by determining whether the input current sensed by the current sensor 400 is within a predetermined normal range. In various embodiments of the present disclosure, the controller 200 may include a MCU Motor Control Unit (MUC) and a Vehicle Control Unit (VCU), and so on. In addition, the controller 200 may determine whether the coolant circulation system is failed or not by determining whether the RPM sensed by the RPM sensor 500 is within a predetermined normal range.

More specifically, the controller 200, as shown in FIG. 2, may determine as the load shortage fault of the coolant circulation system when the input current sensed by the current sensor 400 is equal to or lower than a lower limit value of the predetermined normal range and the RPM sensed by the RPM sensor 500 is equal to or more than an upper limit value of the predetermined normal range, to start a fault count. According to an exemplary embodiment, the predetermined normal range of the input current may be 0.8-6 A and the predetermined normal range of the RPM may be 800-3300 RPM. In other words, the controller 200 may determine as a coolant shortage state of the coolant circulation system when the input current is equal to or lower than 0.8 A and the actual RPM is equal to or more than 3300 RPM and start the fault count.

Furthermore, when the input current is equal to or lower than the lower limit value of the predetermined normal range and the actual RPM is equal to or greater than the upper limit value of the predetermined normal range for a predetermined time or longer, the controller 200 may increase the fault count of the coolant circulation system by one. When the accumulated fault count becomes equal to or greater than the predetermined count, it may be determined as a final fault of the coolant circulation system. Herein, according to an exemplary embodiment, the predetermined normal range may be 0.8-6 A, the predetermined normal range of the RPM may be 800-3300 RPM, the predetermined time may be 2 seconds and the predetermined count may be 10. More specifically, referring to FIG. 2, the controller 200 may increase the fault count of the coolant circulation system by 1 (one) when the input current is equal to or lower than 0.8 A and the actual RPM is equal to or greater than 3300 RPM for 2 seconds or longer, and may determine as the final fault of the coolant circulation system when the accumulated fault count is equal to or greater than 10. At this time, the reason why the fault count is started when it is equal to or longer than the predetermined time and it is determined as the final fault when the accumulated count reaches the specific count, is to prevent an excessive diagnosis of a temporary operation abnormality as the fault and to reduce the possibility of fault diagnosis.

Furthermore, when it is determined that the coolant circulation system is the final fault, the controller 200 can provide a final fault state alarm to a driver. At this time, the controller 200 can provide a fault alarm to the driver via a speaker, cluster, or AVN (Audio Video Navigation) mounted at a vehicle, and so on. According to an exemplary embodiment of the present disclosure, by notifying the driver of whether the coolant circulation system is finally failed, the driver can easily confirm whether the coolant circulation system is failed or not, and accordingly, by repairing the fault of the coolant circulation system, it is able to prevent safety accidents caused by the fault of the coolant circulation system.

On the other hand, when the accumulated fault count is equal to or lower than the predetermined count, the controller 200 may operate the water pump 100 again after turning off the water pump 100 for a certain period of time. According to an exemplary embodiment, when the accumulated fault count is equal to or lower than 10, the controller 200 may operate the water pump 100 again after turning off the water pump 100 for 5 seconds. In addition, when the input current and the actual RPM are maintained within the predetermined normal range for the predetermined time, the controller 200 may reset the accumulated fault count to zero. Herein, the predetermined time may be 10 seconds. That is, when the input current and the actual RPM are maintained within the predetermined normal range for 10 seconds or longer, the controller 200 may reset the accumulated fault count to zero.

On the other hand, as shown in FIG. 3, the controller 200 may determine as the excessive load fault of the coolant circulation system when the input current is equal to or greater than the upper limit value of the predetermined normal range and the actual RPM is equal to or lower than the lower limit value of the predetermined normal range, and start the fault count. According to an exemplary embodiment, the predetermined normal range of the input current may be 0.8-6 A and the predetermined normal range of the RPM may be 800-3300 RPM. In other words, the controller 200 may determine as the excessive load fault of the coolant circulation system when the input current is equal to or greater than 6 A and the actual RPM is equal to or lower than 800 RPM, and start the fault count. Herein, the excessive load fault of the coolant circulation system means that the water pump driver 300 is not driven properly due to foreign substances or the like to require more input current when it is in a normal state in order to drive with RPM of the RPM command, or a state where the actual RPM when the same input current is input is lower than when it is in a normal state.

Furthermore, when the input current is equal to or greater than the upper limit value of the predetermined normal range and the actual RPM is equal to or lower than the lower limit value of the predetermined normal range for the predetermined time or longer, the controller 200 may increase the fault count of the coolant circulation system by one, but the controller 200 may determine as the final fault of the coolant circulation system when the accumulated fault count is equal to or greater than the predetermined count. Herein, according to an exemplary embodiment, the predetermined normal range of the input current may be 0.8-6 A, the predetermined normal range of the RPM may be 800-3300 RPM, the predetermined time may be 2 seconds and the predetermined count may be 10. Specifically, referring to FIG. 3, when the input current is equal to or greater than 6 A and the actual RPM equal to or lower than 800 RPM is lasted for 2 seconds or longer, the controller 200 may increase the fault count of the coolant circulation system by one. The controller 200 may determine as the final fault of the coolant circulation system when the accumulated fault count is equal to or greater than 10. At this time, the reason why the fault count is started when it is equal to or longer than the predetermined time and it is determined as the final fault when the accumulated count reaches the specific count, is to prevent an excessive diagnosis of a temporary operation abnormality as the fault and to reduce the possibility of a fault diagnosis.

Furthermore, when it is determined that the coolant circulation system is the final fault, the controller 200 can provide the final fault state alarm to a driver. At this time, the controller 200 can provide the fault alarm to the driver via a speaker, cluster, or AVN (Audio Video Navigation) mounted at a vehicle, and so on. According to an exemplary embodiment of the present disclosure, by notifying the driver of whether the coolant circulation system is finally failed, the driver can easily confirm whether the coolant circulation system is failed or not, and accordingly, by repairing the fault of the coolant circulation system, it is able to prevent safety accidents caused by the fault of the coolant circulation system. On the other hand, when the accumulated fault count is equal to or lower than the predetermined count, the controller 200 may operate the water pump 100 again after turning off the water pump 100 for the certain period of time. According to an exemplary embodiment, when the accumulated fault count is equal to or lower than 10, the controller 200 may operate the water pump 100 again after turning off the water pump 100 for 5 seconds.

In addition, when the input current and the actual RPM are maintained within the predetermined normal range for the predetermined time, the controller 200 may reset the accumulated fault count to zero. Herein, the predetermined time may be 10 seconds. That is, when the input current and the actual RPM are maintained within the predetermined normal range for 10 seconds or longer, the controller 200 may reset the accumulated fault count to zero.

Although specific embodiments of the present disclosure has been described and illustrated, those skilled in the art will appreciate that various alternations and modifications are possible without departing from the technical spirit of the present disclosure as disclosed in the appended claims.

What is claimed is:

1. A fault diagnosis apparatus of a coolant circulation system for a vehicle, comprising:
 a water pump for circulating coolant;
 a controller for applying a revolutions per minute (RPM) command to the water pump;
 a water pump driver for operating the water pump depending on the applied RPM command;
 a current sensor for sensing a current input to the water pump driver; and
 an RPM sensor for sensing an actual RPM of the water pump driver,
 wherein the controller determines whether the input current sensed by the current sensor is within a first predetermined normal range to determine whether the coolant circulation system is failed or not,
 wherein the controller determines whether the coolant circulation system is failed or not by determining whether the actual RPM sensed by the RPM sensor is within a second predetermined normal range, and
 wherein the controller determines a load shortage fault of the coolant circulation system when the input current is equal to or lower than a lower limit value of the first predetermined normal range and the actual RPM is equal to or greater than an upper limit value of the second predetermined normal range, and starts a fault count when the load shortage fault is determined.

2. The fault diagnosis apparatus of claim 1, wherein the controller increases the fault count of the coolant circulation system by one when the input current is equal to or lower than the lower limit value of the first predetermined normal range and the actual RPM is equal to or greater than the upper limit value of the second predetermined normal range for a predetermined time or longer, and determines as a final fault of the coolant circulation system when an accumulated fault count becomes equal to or greater than a predetermined count.

3. The fault diagnosis apparatus of claim 2, wherein the controller provides a final fault state alarm to a driver when it is determined that the coolant circulation system becomes the final fault.

4. The fault diagnosis apparatus of claim 2, wherein the controller operates the water pump again after turning off the water pump for a certain period of time when the accumulated fault count is equal to or lower than the predetermined count.

5. The fault diagnosis apparatus of claim 2, wherein the controller resets the accumulated fault count to zero when the input current and the actual RPM are maintained within the first and second predetermined normal ranges, respectively, for the predetermined time.

6. A fault diagnosis apparatus of a coolant circulation system for a vehicle, comprising:
a water pump for circulating coolant;
a controller for applying a revolutions per minute (RPM) command to the water pump;
a water pump driver for operating the water pump depending on the applied RPM command;
a current sensor for sensing a current input to the water pump driver; and
an RPM sensor for sensing an actual RPM of the water pump driver,
wherein the controller determines whether the input current sensed by the current sensor is within a first predetermined normal range to determine whether the coolant circulation system is failed or not,
wherein the controller determines whether the coolant circulation system is failed or not by determining whether the actual RPM sensed by the RPM sensor is within a second predetermined normal range, and
wherein the controller determines an excessive load fault of the coolant circulation system when the input current is equal to or greater than an upper limit value of the first predetermined normal range and the actual RPM is equal to or lower than a lower limit value of the second predetermined normal range, and starts a fault count when the excessive load fault is determined.

7. The fault diagnosis apparatus of claim 6, wherein the controller increases the fault count of the coolant circulation system by one when the input current is equal to or greater than the upper limit value of the first predetermined normal range and the actual RPM is equal to or lower than the lower limit value of the second predetermined normal range for a predetermined time or longer, and
the controller determines as a final fault of the coolant circulation system when an accumulated fault count is equal to or greater than a predetermined count.

8. The fault diagnosis apparatus of claim 6, wherein the controller provides a final fault state alarm to a driver when it is determined that the coolant circulation system becomes a final fault.

9. The fault diagnosis apparatus of claim 6, wherein the controller operates the water pump again after turning off the water pump for a certain period of time when an accumulated fault count is equal to or lower than a predetermined count.

10. The fault diagnosis apparatus of claim 6, wherein the controller resets an accumulated fault count to zero when the input current and the actual RPM are maintained within the first and second predetermined normal ranges for a predetermined time.

* * * * *